(12) United States Patent
Maekawa et al.

(10) Patent No.: US 6,888,344 B2
(45) Date of Patent: May 3, 2005

(54) TEST PROBE FOR SEMICONDUCTOR DEVICES, METHOD OF MANUFACTURING OF THE SAME, AND MEMBER FOR REMOVING FOREIGN MATTER

(75) Inventors: Shigeki Maekawa, Tokyo (JP); Megumi Takemoto, Tokyo (JP); Kazunobu Miki, Tokyo (JP); Mutsumi Kano, Tokyo (JP); Takahiro Nagata, Tokyo (JP); Yoshihiro Kashiba, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 139 days.

(21) Appl. No.: 10/285,625

(22) Filed: Nov. 1, 2002

(65) Prior Publication Data

US 2003/0090280 A1 May 15, 2003

Related U.S. Application Data

(62) Division of application No. 09/121,870, filed on Jul. 24, 1998.

(30) Foreign Application Priority Data

| Jul. 24, 1997 | (JP) | 9-198534 |
| Sep. 12, 1997 | (JP) | 9-248493 |
| Feb. 20, 1998 | (JP) | 10-38429 |
| Feb. 20, 1998 | (JP) | 10-38430 |

(51) Int. Cl.$^7$ ............................................. G01R 1/04
(52) U.S. Cl. ................................. 324/158.1; 324/754
(58) Field of Search .......................... 324/158.1, 754, 324/765; 451/59, 533; 438/14–18

(56) References Cited

U.S. PATENT DOCUMENTS 3,607,607 A * 9/1971 Beninga ..................... 161/168

3,628,144 A 12/1971 Aronstein et al.
(Continued)

FOREIGN PATENT DOCUMENTS

| EP | 0 660 387 A3 | 6/1995 |
| EP | 0 660 387 A2 | 6/1995 |

(Continued)

OTHER PUBLICATIONS

XP–00089949, Nadeau et al., "An Analysis of Tungsten Probes' Effect on Yields in a Production Wafer Probe Environment", Proceedings of the International Test Conference, III Comp. Soc. Press, vol. Conf. 20, 1989, p. 208–215.

(Continued)

*Primary Examiner*—Kamand Cuneo
*Assistant Examiner*—Jimmy Nguyen
(74) *Attorney, Agent, or Firm*—Burns, Doane, Swecker & Mathis, LLP

(57) ABSTRACT

A test probe for semiconductor devices, the test probe having a tip portion which is pressed against a test pad of a semiconductor device to establish electrical contact between the tip portion and the pad for testing the operation of the semiconductor device, wherein the probe is formed to have a tip shape with an angle of not less than 15 degrees formed at the surface of the pad between a tangential line with respect to a tip face of the probe and the pad surface when the probe is pressed against the pad, the tip shape of the probe having a spherical surface meeting the relationship of:

$$\theta = \cos^{-1}(1 - t/R) \geq 15°$$

where the radius of curvature of the spherical surface is R, the thickness of the pad is t, and the angle formed at the pad surface between the tangential line with respect to the probe tip face and the pad surface when the probe is pressed against the pad is θ, the probe have a flat portion at an end of the tip portion. Accordingly, a contact surface can be established between the probe trip and the pad with a sufficient degree of electrical continuity, and when the the probe level is adjusted in the probing, a time required for positioning the probe prior to the start of measurement is cut down and variation in measurement are reduced.

5 Claims, 18 Drawing Sheets

U.S. PATENT DOCUMENTS

| | | |
|---|---|---|
| 3,676,776 A | 7/1972 | Bauer et al. |
| 3,882,597 A | 5/1975 | Chayka et al. |
| 4,481,467 A | 11/1984 | Alexandersen et al. |
| 4,547,923 A | 10/1985 | DeVries et al. |
| 4,590,422 A | 5/1986 | Milligan |
| 4,993,957 A | 2/1991 | Shino |
| 5,060,051 A | 10/1991 | Usuda |
| 5,090,118 A | 2/1992 | Kwon et al. |
| 5,225,037 A | 7/1993 | Elder et al. |
| 5,486,279 A | 1/1996 | Friese et al. |
| 5,603,876 A | 2/1997 | Honma et al. |
| 5,695,386 A | 12/1997 | Ryoke et al. |
| 5,961,728 A | 10/1999 | Kiser et al. |
| 5,968,282 A | 10/1999 | Yamasaka |
| 6,056,627 A | 5/2000 | Mizuta |
| 6,118,289 A | 9/2000 | Kitani et al. |
| 6,130,104 A | 10/2000 | Yamasaka |

FOREIGN PATENT DOCUMENTS

| | | |
|---|---|---|
| JP | 57-155331 | 9/1982 |
| JP | 63-128264 | 5/1988 |
| JP | 2-54814 | 2/1990 |
| JP | 05140613 | 6/1993 |
| JP | 5-273237 | 10/1993 |
| JP | 6-018560 | 1/1994 |
| JP | 6-289056 | 10/1994 |
| JP | 6-291167 | 10/1994 |
| JP | 0726772 | 5/1995 |
| JP | 7-209376 | 8/1995 |
| JP | 7-244074 | 9/1995 |
| JP | 8-50144 | 2/1996 |
| JP | 8-166407 | 6/1996 |
| JP | 8-292209 | 11/1996 |
| JP | 2000-147004 | 5/2000 |

OTHER PUBLICATIONS

"Super–Thinning of Probe Card Tip", *Toshiba Technique Public Document,* No. 95–0447, vol. 13–50, pp. 117–118, Jul. 24, 1995 (English language translation of excerpts thereof).

XP–002140401, Schliefer, Improving Wafer Sort Yields with Radius–Tip Probes, 1990, IEEE International Test Conference Proceedings, paper 39.2, pp. 869–899.

Japanese Patent Application JP–11241690 and English version of claims.

* cited by examiner $$\left(\frac{W}{2}\right)^2 = R^2 - (R-t)^2$$

x 10000 x 10000

TEST PROBE FOR SEMICONDUCTOR DEVICES, METHOD OF MANUFACTURING OF THE SAME, AND MEMBER FOR REMOVING FOREIGN MATTER

This application is a divisional of application Ser. No. 09/121,870, filed Jul. 24, 1998.

BACKGROUND OF THE INVENTION

1. Field of the Invention

The present invention relates to a probe used for testing the operation of semiconductor integrated circuits which are formed on semiconductor wafers, a method of the same, and a member for removing metals, metal oxides, contaminants obstructing electrical contact, etc. which are adhering to the probe.

2. Description of the Related Art

In a conventional probe, as shown in FIG. 22A, a testing (probing) is carried out by attaching a probe 202 having a fore end bent into a hook-like shape to a probe card 201 which is vertically movable, and pushing the probe 202 against a test pad of a semiconductor integrated circuit (referred to as a pad hereinafter) in such a condition that an oxide film on the pad surface is broken off to establish true contact (electrical contact) between the probe and a fresh surface of the pad. The condition of a probe tip under the probing is shown in FIG. 22B. For the sake of explanation, FIG. 22B is illustrated in the form of a simplified model with respect to dimensions and so on. A tip 200 of the conventional probe 202 is originally finished to have a flat end face, as shown in FIG. 22B. Even when the probe tip is machined to have a spherically curved surface intentionally, a sphere approximating the curved surface has a radius R of curvature as large as 20–30 $\mu$m. At the time of probing, therefore, the whole of flat end portion first comes into contact with a pad 203 while an oxide film 204 and contaminants on the surface of the pad 203 are interposed between the probe tip and the pad surface. Then, as the probe 202 is more closely pushed against the pad 203, the oxide film 204 on the surface of the pad 203 is partly broken off to produce an electrical continuity region 206 in which electrical true contact can be established, thereby enabling a continuity test to be performed. With repetition of the probing, however, the oxide film 204 is accumulated on a heel portion 205 of the probe 202 which is subject to maximum stresses, and an area of the true contact with the pad 203 is so reduced as to make electrical continuity unstable. To reliably establish the electrical contact, vibration is applied to the probe tip in Japanese Unexamined Patent Publication No. 6-18560, for example.

Further, tungsten used as materials of the probe 202 is in the form of a powder sintered compact which has material defects (voids) therein. Accordingly, when the powder sintered compact is machined so as to provide a tip shape of the probe 202, the material defects appear on the probe surface. Pad materials such as aluminum, for example, enter the material defects appearing in the tip (end) face of the probe 202 to form deposition nuclei and grow into deposits. As a result, contact resistance is increased.

For removing those material defects, heat treatment is applied to tungsten materials in Japanese Unexamined Patent Publication No. 5-140613, for example.

In addition, the card probe 202, which serves as an interface for electrical signals transferred between a tester for measuring electrical characteristics of a semiconductor integrated circuit formed on a wafer, and the semiconductor integrated circuit, is brought into pressure contact with the pad 203 of the semiconductor integrated circuit in such a manner as to scrape off an aluminum alloy forming the pad 203. Therefore, scraped-off parts of materials of the pad 203, such as aluminum and an aluminum oxide, and/or of contaminants remaining on the surface of the pad 203 adhere to the tip of the probe 202. Unless those adhering substances or deposits are removed from the tip of the probe 202, the contact resistance between the probe 202 and the pad 203 is so increased that the electrical characteristics of the semiconductor integrated circuit cannot be accurately measured. In other words, if the probe 202 is used for a long period of time with the deposits kept accumulated on the tip of the probe 202, the contact resistance increases over time.

For those reasons, it is customary to clean out the tip of the probe 202 and remove foreign matter adhering to it whenever the probing is repeated a predetermined number of times.

For example, Japanese Unexamined Patent Publication No. 7-244074 discloses an abrasive sheet formed by mixing fine-grained abrasives for grinding in an elastic matrix and then shaping the matrix into a sheet. The abrasive sheet is attached, instead of a semiconductor wafer, onto a wafer moving table of a probe apparatus which is operated to made a semiconductor integrated circuit and a probe contacted with each other. The wafer moving table is vertically moved to press a tip of the probe against the surface of the abrasive sheet, whereupon contact friction is caused between the tip face of the probe and the fine-grained abrasives dispersed in the abrasive sheet to remove foreign matter adhering to the probe tip.

Thus, in the conventional probe having the above-described construction, as shown in FIG. 22B, the true contact area (electrical continuity region 206) between the tip 200 of the probe 202 and the pad 203 is very small during the test of electrical characteristics. Accordingly, a sufficient degree of electrical continuity is not obtained between the probe 202 and the pad 203 in some cases.

Also, voids produced in tungsten materials of the probe 202 are conceivably eliminated by heat treatment. However, if the tungsten materials are subject to heat treatment at a temperature not lower than the recrystallization temperature, there arises another problem that the probe materials become brittle.

Further, the conventional abrasive sheet for removing foreign matter adhering to the tip 200 of the probe 202 is formed by mixing fine-grained abrasives in an elastic matrix and is deformed upon the tip 200 of the probe 202 being pressed against the surface of the abrasive sheet. As shown in FIG. 23, therefore, the tip 200 of the probe 202 is forced to come into a matrix 210 and abraded by fine-grained abrasives 211 over a region indicated by dotted lines. This tip abrasion raises a problem that, with repetition of cleaning, the probe tip is thinned and eventually loses strength to such an extent that it may bend or chip.

SUMMARY OF THE INVENTION

With a view of solving the problems mentioned above, an object of the present invention is to provide a probe which can increase a true contact area between a probe tip and a pad and hence establish reliable electrical contact.

Another object of the present invention is to provide a member for removing foreign matter adhering to the probe tip, which can prevent the probe tip from being thinned with repetition of cleaning and hence has a longer service life.

To this end, according to the present invention, there is provided a test probe for semiconductor devices, the test probe having a tip portion which is pressed against a test pad of a semiconductor device to establish electrical contact between the tip portion and the pad for testing the operation of the semiconductor device, wherein the probe is formed to have a tip shape with an angle of not less than 15 degrees formed at the surface of the pad between a tangential line with respect to a tip face of the probe and the pad surface when the probe is pressed against the pad, the tip shape of said probe having a spherical surface meeting the relationship of:

$$\theta = \cos^{-1}(1-t/R) \geq 15°$$

where the radius of curvature of the spherical surface is R, the thickness of the pad is t, and the angle formed at the pad surface between the tangential line with respect to the probe tip face and the pad surface when the probe is pressed against said pad is θ, the probe having a flat portion at an end of the tip portion.

According to another aspect of the present invention, there is provided a method of manufacturing a test probe for semiconductor devices, the test probe having a tip portion which is pressed against a test pad of a semiconductor device to establish electrical contact between the tip portion and the pad for testing the operation of the semiconductor device, wherein the probe is made of a linear metal material prepared by sintering powdered raw materials, and is subject to heat treatment in an atmosphere of non-oxidizing gas under such conditions that a treatment temperature is not higher than the recrystallization of the metal material and the pressure of the non-oxidizing gas is raised to a level at which the volume of the metal material contracts over time.

According to another aspect of the present invention, there is a member for removing foreign matter adhering to a probe tip, wherein the member comprises a resin member capable of elastic deformation, a first metallic member formed on the surface of said resin member as a film having predetermined tensile strength, and a ceramic member formed on the surface of the metallic member as a film having a predetermined thickness.

According to another aspect of the present invention, there is a member for removing foreign matter adhering to a probe tip, wherein the member comprises a resin member having a Young's modulus of 100–400 kgf/mm$^2$, a metallic member formed on the surface of the resin member as a film having a tensile strength of not less than 20 kgf/mm$^2$ and a thickness of 50–150 angstroms, a nickel plated layer formed on the surface of the metallic member in a thickness of not more than 5 microns, and ceramic particles fixedly dispersed in the nickel plated layer and having a diameter smaller than the thickness of the nickel plated layer.

According to another aspect of the present invention, there is a member for removing foreign matter adhering to a probe tip, wherein the member comprises a resin member having a Young's modulus of 100–400 kgf/mm$^2$, a metallic member formed on the surface of the resin member as a film having tensile strength of not less than 20 kgf/mm$^2$ and a thickness of 50–150 angstroms, a nickel plated layer formed on the surface of the metallic member in thickness of not more than 5 microns, and silicon particles or silicon carbide particles fixedly dispersed in the nickel plated layer and having a diameter smaller than the thickness of the nickel plated layer.

DESCRIPTION OF THE PREFERRED EMBODIMENTS

Preferred embodiments of the present invention will be described below with reference to the drawings.

Embodiment 1

Figure 1A:
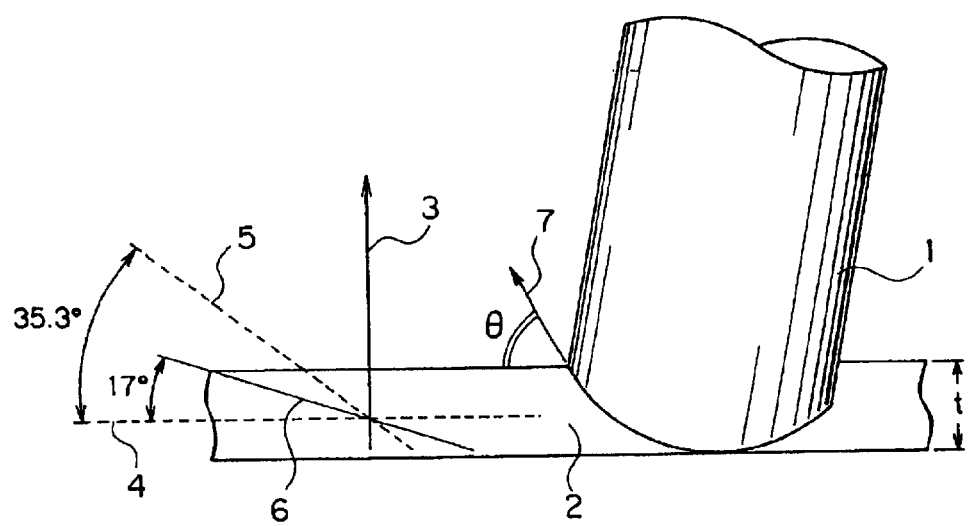
FIGS. 1A and 1B are explanatory views each showing a contact condition of a probe according to Embodiment 1 of the present invention and a pad.
Figure 1B:
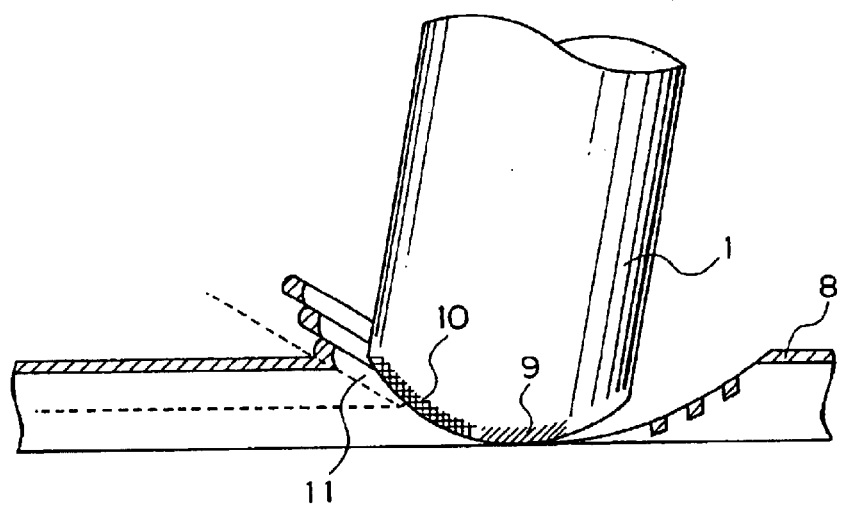

FIGS. 1A and 1B are explanatory views each showing a contact condition of a probe according to Embodiment 1 of the present invention and a pad. In these drawings, denoted by reference numeral 1 is a probe, 2 is a pad, 3 is a crystal orientation of the pad 2, 4, 5 and 6 are slip planes, 7 is a vector in the tangential direction with respect to a tip face of the probe 1, 8 is an oxide film formed on the surface of the pad 2, 9 is an oxide-film-adhering region, 10 is an electrical continuity region, and 11 is a shearing deformation. In the probing, as shown in FIG. 1B, electrical continuity between the probe 1 and the pad 2 is established upon the probe 1 causing a shearing deformation in the pad 2 to break off the oxide film 8 on the pad surface and then coming into contact with a fresh surface of the pad 2. The angle at which a shearing deformation may occur depends on the orientation of crystals produced by sputtering. For an aluminum pad, for example, it is known that the crystal orientation 3 of the pad 2 during the sputtering is aligned with respect to the lattice place (111), i.e., exhibits the so-called C-axis orientation, as shown in FIG. 1A. An angle formed between the slip plane 4 represented by (111) and the pad surface is 0 degree. Of other slip planes, the slip plane 5 forming the pad surface at a minimum angle is given by any of (110), (101) and (011), and that angle is 35.3 degrees. If shearing may occur only at the angle of the slip plane, the pad should be subject to a shearing deformation just at discrete angles such as 0 degree, 35.3 degree, and so on. As a result of experiments, however, it was found that a shearing deformation occurs at various angles rather than discrete angles. This is attributable to that shearings along the slip plane 4 and the slip plane 5 are combined with each other, causing the shearing deformation 11 to occur as shown in FIG. 1B. It was also found from experiments that an angle of the slip plane 6 along which shearing may occur at a minimum angle is 15 degrees, and an angle of the slip plane 6 along which shearing can stably occur is 17 degrees. Accordingly, if the probe end is shaped such that an angle formed between the vector 7 in the tangential direction with respect to the probe tip face and the pad surface is not larger than 15 degrees, preferably 17 degrees, the probe tip can break off the oxide film 8 on the surface of the pad 2 to establish contact with a fresh surface of the pad, and therefore a sufficient degree of electrical continuity is established.

Embodiment 2

Figure 2:
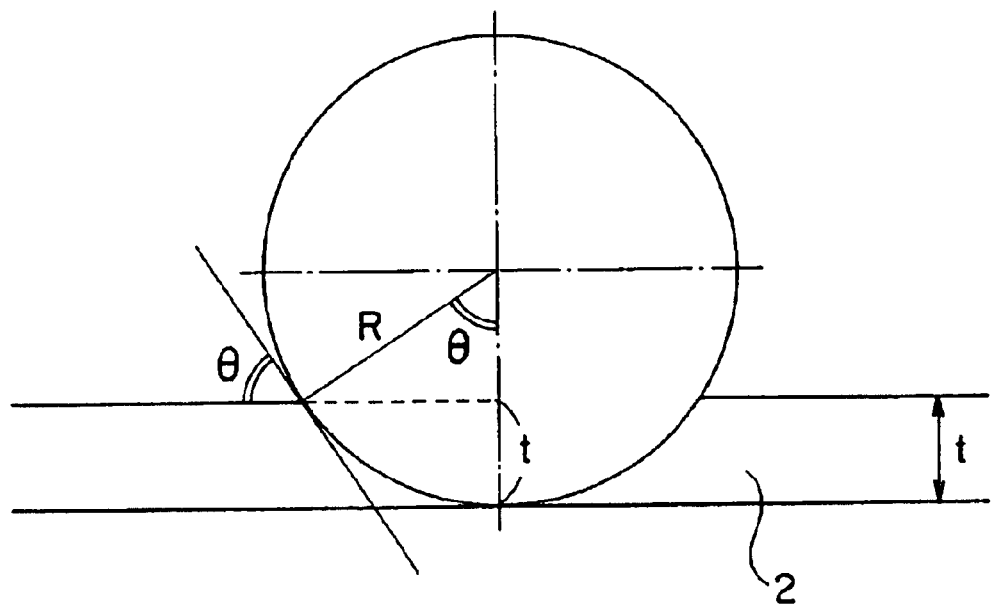
FIG. 2 is an explanatory view showing the relationship between a probe according to Embodiment 2 of the present invention and the pad.

In this embodiment, the tip of the probe 1 is formed to have an end face defined by a spherically curved surface with a radius R, as shown in FIG. 2. Assuming that the film thickness of the pad 2 is t and the angle formed at the pad surface between the tangential direction with respect to the probe tip face and the pad surface is θ, the following relationship holds among R, θ and t:

$$R - R\cos\theta = t$$

Hence, by designing the tip shape of the probe 1 to have a spherically curved surface which meets the relationship of;

$$\theta = \cos^{-1}(1 - t/R) \geq 15°$$

a shearing deformation can be smoothly developed in the pad 2 with relatively small force so that the tip of the probe 1 can establish contact with a fresh surface of the pad and a sufficient degree of electrical continuity is obtained. Note that although the shape of the tip face of the probe 1 is illustrated and described as being spherical for the sake of easier explanation about the relationship between the angle of the slip plane, at which a shearing deformation of the pad material may occur, and the shape of the probe tip, the tip face is not necessarily a perfect spherical surface in practice and a similar advantage can be obtained with the probe having a curved tip face close to a spherical surface.

Figure 6A:
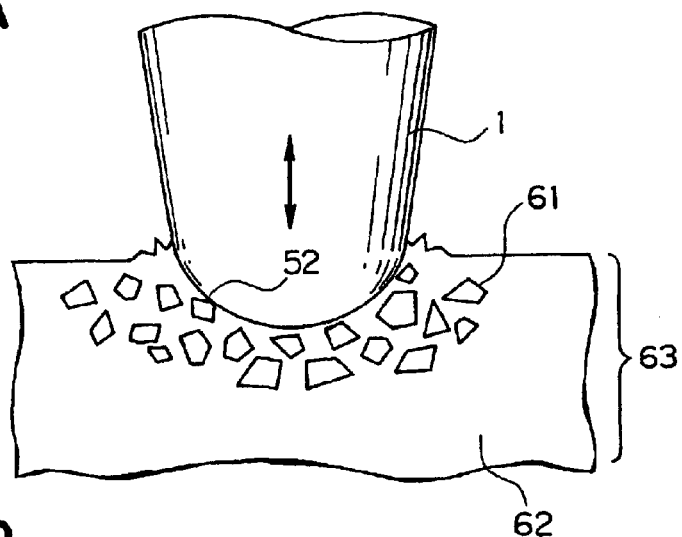
FIGS. 6A, 6B and 6C are explanatory views for explaining a method of manufacturing a probe according to Embodiment 6 of the present invention and the pad.

The above-mentioned shape of the probe tip face can be produced, as shown in FIG. 6A, by repeatedly piercing the probe 1 into an abrasive plate 63 formed by setting abrasive grains 61 with a synthetic resin 62. Starting from a flat state of a tungsten probe tip, for example, a spherically curved surface with a radius of approximately 15 μm is obtained by piercing the probe tip 3000–4000 times into the abrasive plate which is made up of silicone rubber and #3000-mesh diamond abrasive grains at a weight ratio of about 1:3. Further, by piercing the probe tip several hundred times into an abrasive plate in which grinding materials comprise diamond abrasive grains in the range of #6000–10000, surface roughness of the probe tip is improved to a value about 1 μm or less.

Figure 3:
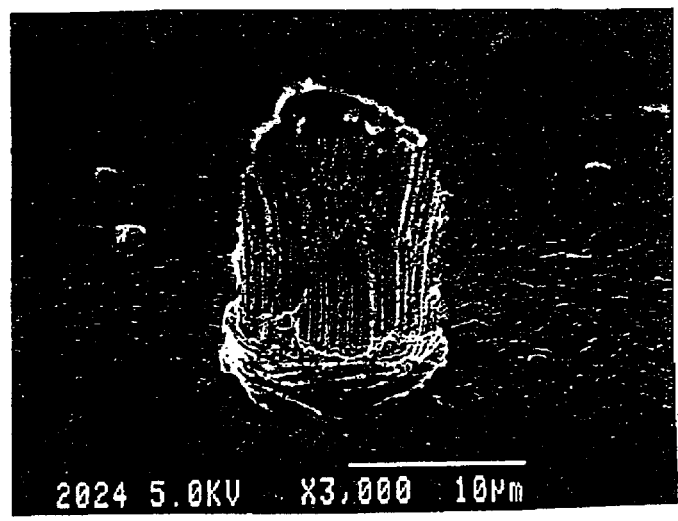
FIGS. 3A and 3B are representations each showing a probe trace left on the pad by the probe according to Embodiment 2 of the present invention.
Figure 3:

FIG. 3 shows trace left on the pad 2, which is made of aluminum, by the probe 1. It is understood that because aluminum 31 has a layered (lamella) structure, the tip of the probe 1 develops shearing deformations in the pad 2 continuously. The layered structure is heaped beyond the 0.8 μm thickness of the pad 2 so as to project on the pad 2. The projected portion on the pad 2 can serve as a start point for contact or joint between the pad and a wire when wire bonding is externally carried out on the pad 2. A cutdown in bonding time and enhancement of bonding strength are therefore expected. Also, because a dimple 32, which is an evidence of ductile rupture, is observed in a contact portion between the tip face of the probe 1 and the pad 2, it is understood that the tip of the probe 1 is in contact with a fresh surface of the pad 2. As a result of conducting a continuity test with the probe of this embodiment, it was confirmed that a failure of electrical continuity did not essentially occur during the test of making contact 20000 times.

While aluminum is used, by way of example, as materials of the test pad in this embodiment, a similar advantage as described above can be obtained so long as the pad is made of any of those materials which develop a slip deformation (shearing deformation) like aluminum. Examples of usable materials include gold, copper, an alloy of aluminum and copper, and an alloy of aluminum and silicon.

Embodiment 3

Figure 4:
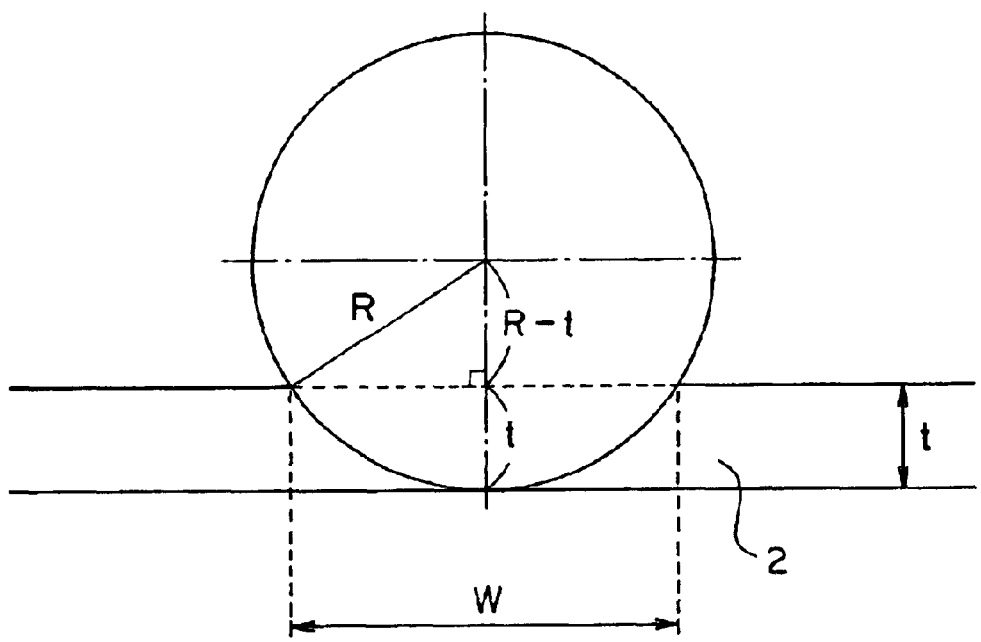
FIG. 4 is an explanatory view showing the relationship between a probe according to Embodiment 3 of the present invention and the pad.

For the test probe 1 which has the tip face formed into a spherically curved surface, assuming that the width of a probe trace marked by the probe 1 contacting the pad 2 is W as shown in FIG. 4, the relationship between W and a radius R of curvature of the probe tip face is below:

$$(W/2)^2 = R^2 - (R-t)^2$$

Hence, R is given by:

$$R = (W^2 + 4t^2)/8t$$

In other words, by monitoring the width of the probe trace, the radius R curvature of the probe tip face can be determined and the probe shape can be checked. On condition that the thickness of the pad 2 is 0.8 μm, if the width W of the probe trace marked in the test pad is 9 μm as a result of observing the probe trace with an optical microscope, the radius R of curvature of the probe tip face is calculated as about 13 µm. Thus, the tip shape of the probe 1 can be easily checked by observing the probe trace with an optical microscope and measuring the width W of the probe trace. Consequently, a conventional step of removing the probe 1 and inspecting the tip of the probe 1 off-line for each check routine can be omitted.

Embodiment 4

Figure 5A:
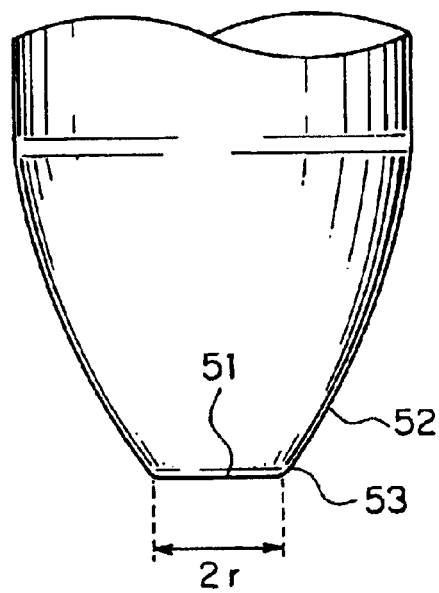
FIGS. 5A and 5B are explanatory views showing a probe according to Embodiments 4 and 5 of the present invention and the relationship between the probe and the pad.

FIG. 5A shows a probe according to Embodiment 4 of the present invention. An apparatus called a prober is employed to perform the operation of contacting a probe with a test pad. In some models of probers, the probe is positioned by optically recognizing a probe tip. Where the radius of curvature of the tip face of the probe according to Embodiment 1 is on the order of several microns, the probe tip face cannot be confirmed by image recognition and automatic alignment cannot be effected in some cases because the probe tip has a spherically curved surface and the depth of a focus of an optical system used for observing the probe tip face is shallow. In this embodiment, therefore, the probe tip is formed to have a flat portion 51 as shown in FIG. 5A. With the provision of the flat portion 52, the probe tip face can be clearly confirmed by image recognition and a time required for automatic alignment can be cut down.

Incidentally, the flat portion 52 is not necessarily perfectly flat, but may be formed to have a flat surface having such a flatness or a spherically curved surface having such a large radius of curvature that either surface can be recognized with an optical system having the depth of a focus on the order of about 3–6 µm.

Embodiment 5

Figure 5B:
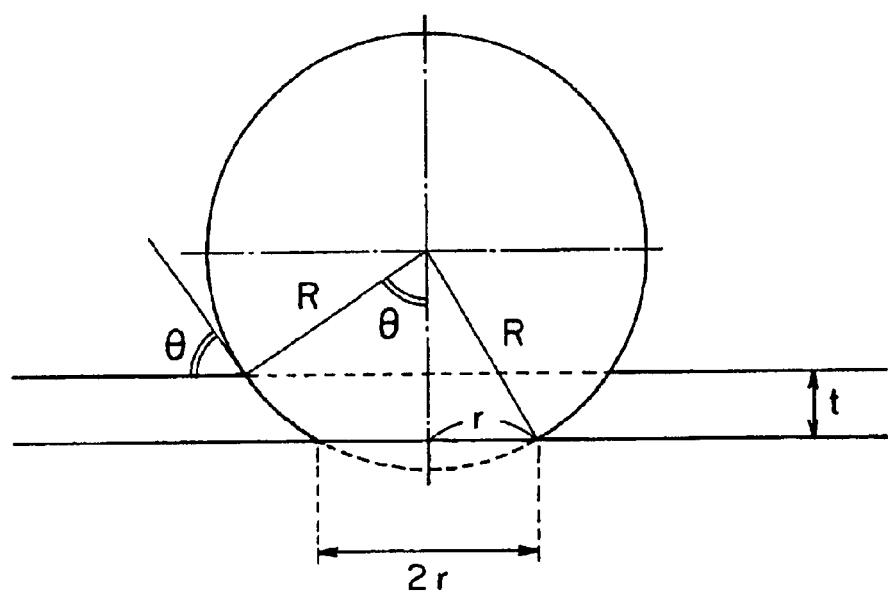

In the probe having such a tip shape as described in above Embodiment 4, assuming that the radius of curvature of a spherical surface portion 52 of the probe tip is R, the radius of the flat portion 51 of the probe tip is r, the film thickness of the test pad is t, and the angle formed at the pad surface between the tangential direction with respect to the spherical surface portion 52 of the probe tip and the pad surface is θ, as shown in FIG. 5B, the following relationship holds:

$$(R^2-r^2)^{1/2}-R \cos \theta = t$$

Therefore, by forming the probe tip to have a spherically curved surface with the radius R of curvature which meets the relationship of;

$$\theta = \cos^{-1}[\{(R^2-r^2)^{1/2}-t\}/R] \geq 15°$$

the probe tip can develop a shearing deformation in the pad to surely break off the oxide film on the pad surface. As a result, the probe tip can be brought into contact with a fresh surface of the pad, and a sufficient degree of electrical continuity can be established.

Additionally, as with Embodiment 3, on-line check of the probe tip shape can be performed based on the following relationship:

$$(W/2)^2 = R^2 - \{(R^2-r^2)^{1/2}-t\}^2$$

Embodiment 6

Figure 6B:
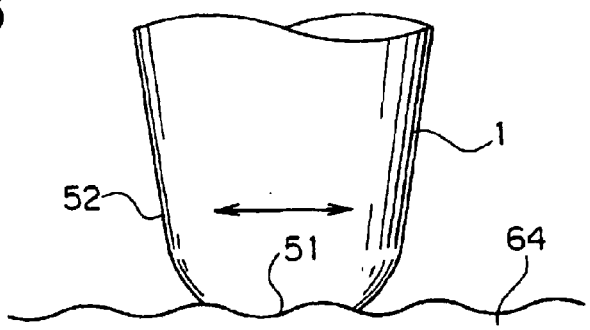
Figure 6C:
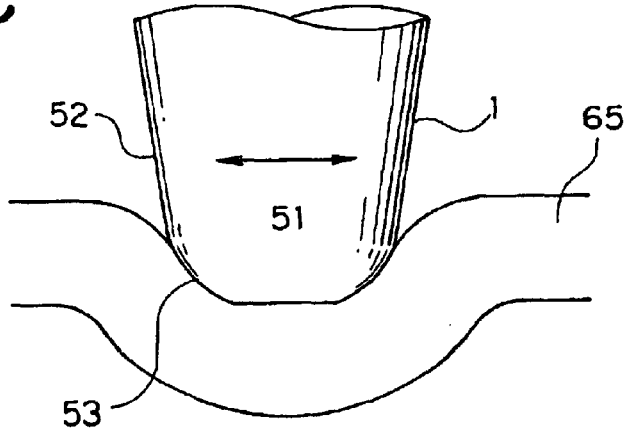
Figure 7A:
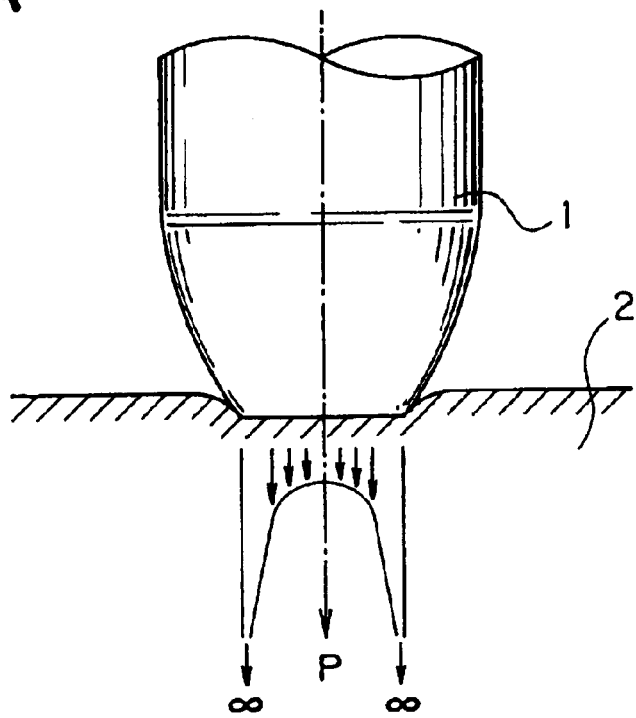
FIGS. 7A and 7B are explanatory views showing stresses applied to the pad from the probe according to Embodiment 6 of the present invention.
Figure 7B:
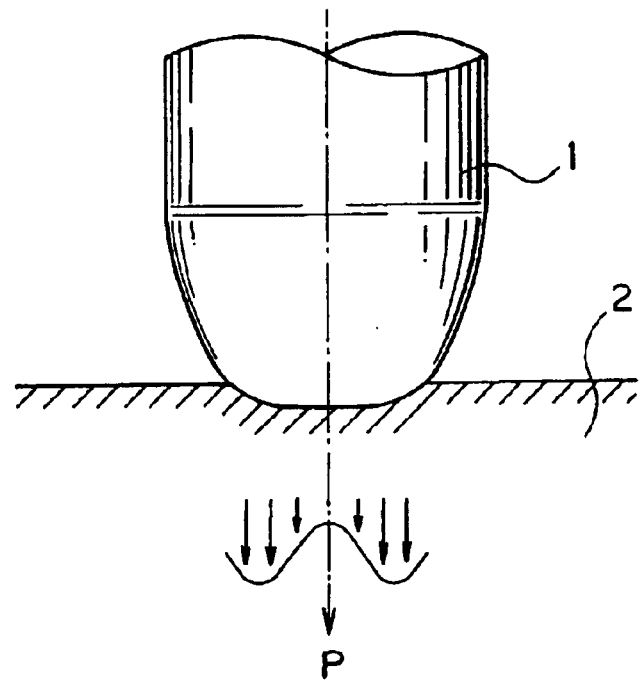

In this embodiment, the probe having such a tip shape as described in above Embodiment 4 is modified to have a curved surface 53 smoothly joining between the flat portion 51 and the spherical surface 52, as shown in FIG. 5A. A probe having the flat portion 51 and the spherical surface 52, which are continuously joined with each other by the curved surface 53, can be manufactured as follows. First, as shown in FIG. 6A, the probe tip is rounded to have the spherical surface 52 with the radius R of curvature by repeatedly piercing the probe 1 into the abrasive plate 63 formed by setting the abrasive grains 61 with the synthetic resin 62. Then, as shown in FIG. 6B, the probe tip is rubbed against a ceramic plate 64 having higher rigidity than the probe 1, thereby forming the flat portion 51. After that, the probe tip is polished by a polisher 65 having lower rigidity than the probe 1 so that the flat portion 51 and the spherical surface 52 are joined with each other by the smooth curved surface 53. With the probe having the tip shape thus formed, stresses are less concentrated on the pad 2, whereby damages upon the pad 2 and a layer lying under the pad 2 can be abated. FIGS. 7A and 7B show distribution of stresses imposed upon the pad 2 in states before and after the probe is polished by the polisher 65, respectively.

When any of the probes according to Embodiments 1 to 6 is used, the material of the test pad exhibits a specific deformation as shown in FIG. 3. Specifically, the probe tip causes continuous shearing deformations in the pad material, and a trace marked upon displacement of part of the pad material has a layered structure (lamella structure) 31 heaped in multiple layers. When the material of the test pad having the lamella structure is partly displaced, deformation resistance of the test pad material is so small that a stress load applied to the layer lying under the test pad can be reduced. Further, a projection formed by the layered structure heaped on the pad surface serves to promote formation of a joint nucleus in a subsequent step of wire bonding made on the pad. As a result, it is possible to shorten a ultrasonic oscillating time necessary for the wire bonding, and to enhance the bonding strength.

Embodiment 7

Figure 8A:
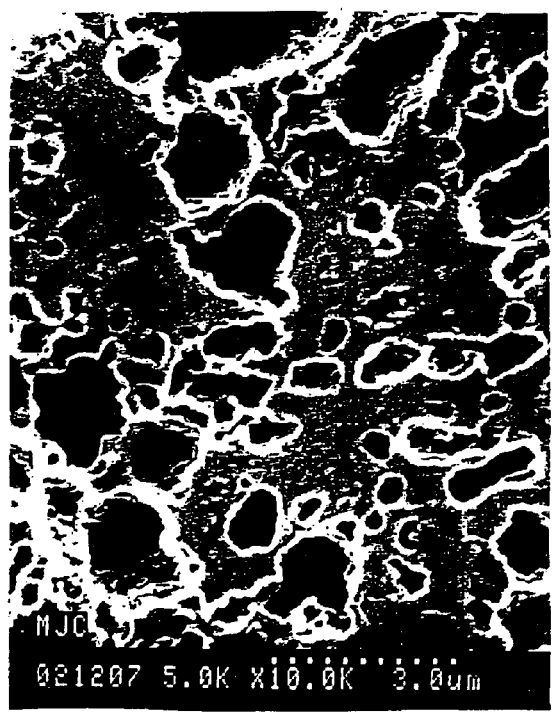
FIGS. 8A and 8B are photographs, taken with an SEM (scanning electron microscope), of respective structures of a general and a probe according to Embodiment 7 of the present invention.
Figure 8B:

For comparison in structure difference between a tungsten probe according to Embodiment of the present invention and a general tungsten probe, FIGS. 8A and 8B show photographs taken with an SEM (scanning electron microscope) after a section of each tungsten probe has been etched. FIG. 8A represents the structure of the general tungsten probe, and FIG. 8B represents the structure of that tungsten probe after it has been subject to heat treatment. A tungsten probe is a sintered compact and hence includes voids in the probe material after sintering. To collapse the voids, the tungsten probe has been conventionally produced by mechanically rolling the probe material after sintering, and then drawing the rolled material to have the probe crystal structure. Even by so producing, the tungsten probe still includes voids of 1–2%. It is conceivable to carry out heat treatment for collapsing the voids. However, if the heat treatment is carried out in a temperature range where the tungsten material is recrystallized, the probe crystal structure of the tungsten material would be disintegrated and the material strength of tungsten itself would be lost. In this embodiment, therefore, voids in the tungsten material are collapsed under a combined effect of temperature and pressure by externally applying a high pressure at relatively low temperatures. For a metal material after being drawn as with tungsten of the probe, there remain considerable machining strains (residual stresses) in the material. It is thought that metal atoms arrayed in random near the grain boundary, in particular, have higher chemical potential energy due to the machining strains, and that those metal atoms are apt to move even at relatively low temperatures.

With the above in mind, in this embodiment, static pressure is externally applied to the metal material including considerable machining strains when it is subject to relatively low temperatures to make metal atoms tend to move, thereby collapsing voids residing near the grain boundary in the, metal material. To this end, heat treatment conditions are set to a temperature not higher than the recrystallization temperature of the metal material, a pressure under which the metal material develops cubical contraction, and a treatment time required for cubical contraction of the metal material under treatment to be almost completed or stopped. Practically, pores (voids) are remarkably reduced by carrying out the heat treatment under conditions of a treatment temperature of 300° C.–600° C., a treatment pressure of 200–2000 atm. and the treatment time of 0.5–5 hours. As a result of repeating experiments under those conditions for heat treatment, it was also found that voids are more remarkably reduced when setting a treatment temperature to 500° C., a treatment pressure to be not lower than 1000 atm and the treatment time to be not shorter than 1 hour. For the pressure condition, the higher the set pressure, the shorter is the required treatment time. However, the pressure apparatus had an upper limit at 2000 atm. To collapse void defects in the material, it has been customary to carry out heat treatment (called HIP treatment) under high pressure at a temperature not lower than the recrystallization temperature of the material (usually a temperature equal to 0.4 or 0.5 of the melting point of the material). On the other hand, in this embodiment, voids can be collapsed by carrying out the heat treatment at a lower temperature that is approximately one digit, i.e., 1/10, lower than the melting point 3400° C. of tungsten, for example.

Further, it was found that as a result of the heat treatment described above, the crystal orientation is markedly aligned in the direction in which the probe material has been drawn. With this effect, an etching or grinding rate in a process of forming the probe tip becomes even, and therefore the probe top can be finished to have a very smooth surface. Consequently, oxides are hard to adhere onto the probe tip, and probing can be performed with good electrical continuity.

In addition, as shown in Table 1 below, mechanical properties also become uniform (e.g., a Young's modulus of the probes varies in the range of $18.8–25.2 \times 10^3$ kgf/mm$^2$ before the heat treatment, but in the range of $22.3–26.3 \times 10^3$ kgf/mm$^2$ after the heat treatment). Hence, by performing the probing with such a probe attached to a probe card, it is possible to reduce extra over-driving or load which has been necessitated in vie of variations in probe properties.

TABLE 1

| Sample | Tensile Load gf | Young's Modulus × 10$^3$ kgf/mm$^2$ |
| --- | --- | --- |
| Probers before heat treatment | 12.800 | 18.8 |
| | 12.960 | 25.2 |
| | 13.060 | 18.8 |
| Probers after heat treatment | 13.520 | 22.3 |
| | 13.800 | 23.8 |
| | 13.840 | 26.3 |

Moreover, the following point was found. Since the tip face of the probe is formed to be smooth, the coefficient of friction between the probe and the test pad material with which the probe comes into contact is reduced. Even with the probe having the conventional tip shape defined by a spherically curved surface with a radius of curvature ranging from 20 to 30 microns, therefore, the pad material is slipped and moved forward of the probe upon being pushed by the probe tip. As a result, an effect of reducing and stabilizing the electrical contact resistance can be obtained.

Accordingly, by forming the probe having the tip shape according to Embodiments 4 and 5 with the material which has been subject to the heat treatment described above, probing under stable electrical contact resistance and automatic recognition of the probe tip position can be achieved. This results in a remarkable reduction in time and cost for the test.

Further, the above heat treatment of the probe enables contact resistance to be stabilized even in the probe having the conventional tip shape.

Figure 9:
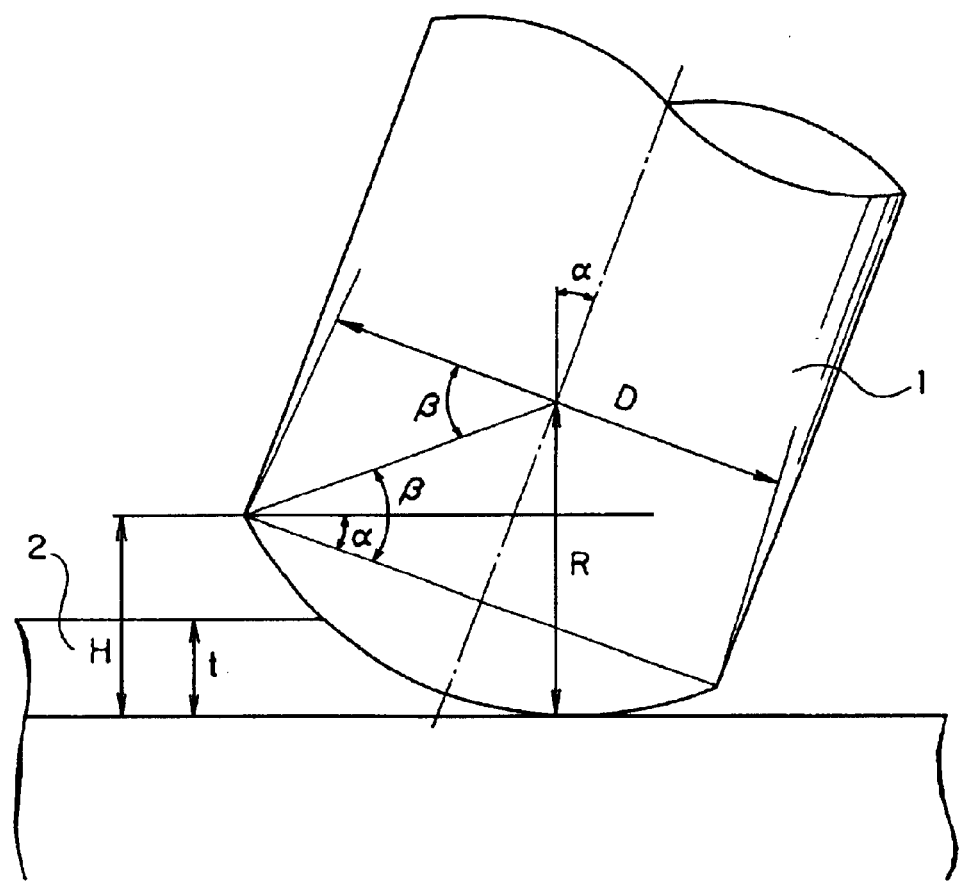
FIG. 9 is an explanatory view showing the relationship between the probe according to Embodiment 7 of the present invention and the pad.

FIG. 9 shows, in the form of a simplified model, a probing state where a probe tip is in contact with a test pad. Assuming, for example, that a probe 1 has a tip shape formed into a spherically curved surface, the radius of curvature of the tip shape is R, the diameter of a beam or stem portion of the probe 1 joining with the spherically curved surface is D, and when the probe 1 contacts at an inclination angle (with a test pad 2 having a thickness t, the greatest distance between a line, at which the beam portion of the probe 1 intersects the spherically curved surface, and a bottom surface of the test pad 2 is H, it is essential to meet not only the following contact condition;

$$H = R - R\ \sin(\beta - \alpha) \geq t\ (\text{where}\ \beta = \cos^{-1}(D/2R))$$

but also the condition explained above in connection with Embodiment 1 for developing a shearing deformation in the pad material. However, material defects in the probe 1 can be eliminated and the tip face of the probe can be finished to be very smooth by heat-treating the probe 1 in a non-oxidizing atmosphere at a temperature not higher than the recrystallizaiton temperature of the metal material while raising the pressure of a non-oxidizing gas to a level enough to make the volume of the metal material contracted over time. As a result, the coefficient of friction between the pad material and the tip face of the probe 1 is so reduced that the pad material is pushed to move forward and the tip face of the probe 1 is brought into contact with a fresh surface of the pad material so long as the probe is in the contact state shown in FIG. 9 regardless of the probe tip shape. It was thus confirmed that stable contact can be obtained due to the effect of the heat treatment even with the probe 1 having the conventional tip shape.

Embodiment 8

Figure 10:
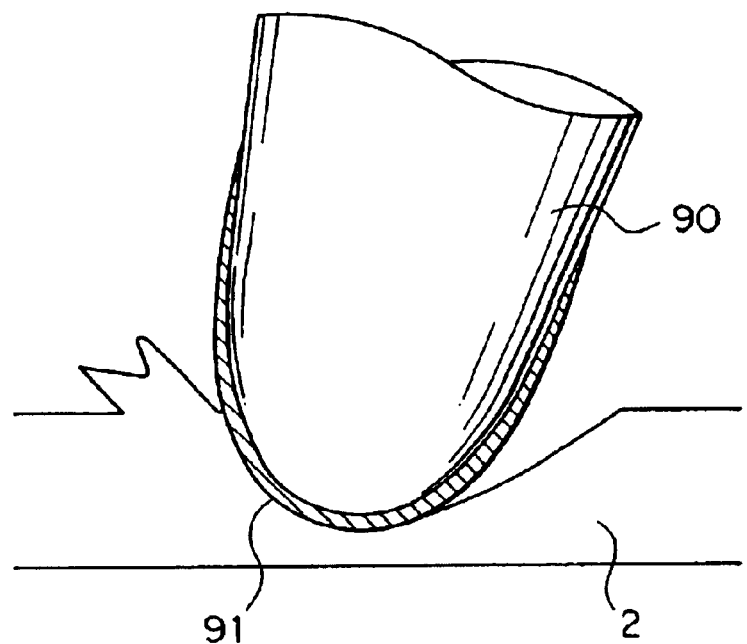
FIG. 10 is an explanatory view showing a probe according to Embodiment 8 of the present invention.

FIG. 10 shows a probe according to Embodiment 8 of the present invention. During the probing, the contact surface between a tip of a probe 90 and a pad 2 may produce high temperatures not lower than 1000° C. due to a shearing deformation. Tungsten is very apt to oxidize under high temperatures. To avoid oxidation of tungsten, in this embodiment, the heat treatment described above in connection with Embodiment 7 is carried on the probe 90, and a surface coating layer 91 of 0.01–0.1 μm made from Pt, Ir, Rh, Au, Cd or an alloy of these elements formed is formed over the tip of the probe 90 by plating or vacuum deposition. By performing the probing with a probe apparatus which includes the probe 90 attached thereto, oxides are more hard to adhere onto the tip of the probe 90 and the probing can be achieved with good electrical continuity.

Embodiment 9

Figure 11:
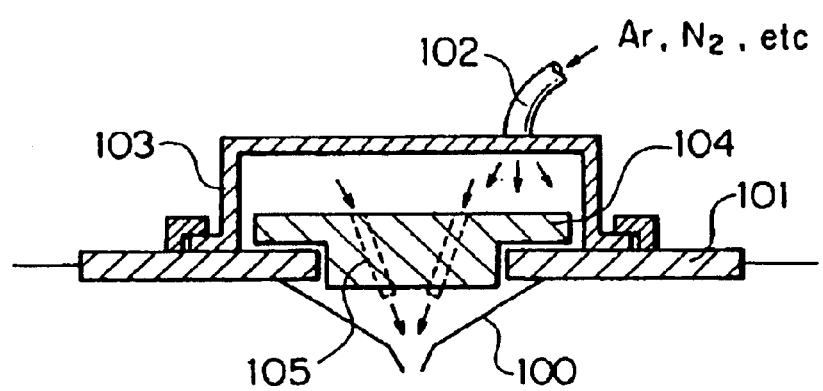
FIG. 11 is a sectional view showing a construction of a probe apparatus according to Embodiment 9 of the present invention.

FIG. 11 is a sectional view showing a construction of a probe apparatus according to Embodiment 9 of the present invention. The probe apparatus includes cantilever probes 100 attached to one side of a probe board (card) 101. The probe board 101 has an opening formed in such a position that tips of the probes 100 can be seen through the opening from the opposite side of the probe board including no probes. A plate 104 provided with nozzles 105 formed therethrough is fitted to the opening of the probe board 101 from the opposite side including no probes in facing relation to the tips of the probes 100 so that gas can be sprayed to the tips of the probes 100. Further, a cover 103 is attached to the opposite side of the probe board 101 in covering relation to the plate 104 so as to define a space between itself and the plate 104. A tube 102 for injecting gas is attached to the cover 103, and a non-oxidizing gas such as argon or nitrogen is injected to the space between the cover 103 and the plate 104 through the tube 102 at a rate of 5–10 liters/minute. The injected non-oxidizing gas is directly sprayed to the tips of the probes 100 from the nozzles 105. Accordingly, the density of the non-oxidizing gas in the vicinity of the probe tips is so increased as to prevent oxidization of the probes 100. Further, since the gas is ejected in violent flows, dust on the wafer can be removed at the same time.

In addition, by attaching cantilever probes, which have been subject to the heat treatment described above in connection with Embodiment 7, to the probe apparatus thus constructed, electrical continuity during the probing is improved and oxidization of the probes can be avoided.

Embodiment 10

Figure 12:
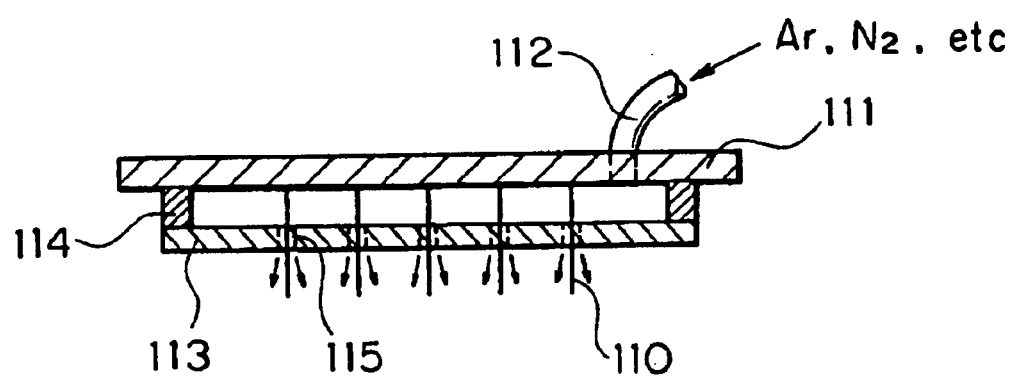
FIG. 12 is a sectional view showing a construction of a probe apparatus according to Embodiment 10 of the present invention.

FIG. 12 is a sectional view showing a construction of a probe apparatus according to Embodiment 10 of the present invention. The probe apparatus has a multi-layered structure comprising a plurality of vertical or like probes 110, a probe fixed plate 111, and a plate 113 provided with guide holes 115 for guiding the probes 110. A space is defined between the probe fixed plate 111 and the plate 113 provided with the guide holes 115, and is sealed off by an air-tight seal 114, thereby providing an air-tightly sealed structure. The guide holes 115 each have a diameter 1.2–1.5 times larger than the diameter of the guide holes 115. With that structure, by supplying a non-oxidizing gas to the enclosed space between the probe fixed plate 111 and the plate 113 and ejecting the non-oxidizing gas through the guide holes 115 at a rate of 2–5 liters/minute, a non-oxidizing atmosphere can be produced near the tip of each of the probes 110 and oxidization of the probes 110 is avoided. Further, since the gas is ejected in violent flows, dust on the wafer can be removed at the same time.

In addition, by attaching vertical or like probes, which have been subject to the heat treatment described above in connection with Embodiment 7, to the probe apparatus thus constructed, electrical continuity during the probing is improved and oxidization of the probes can be avoided.

While the above embodiments have been described in connection with the probes and the probe apparatus for testing primarily wafers on which semiconductor integrated circuits are formed, the present invention is also applicable to, by way of example, probes used for testing semiconductor products fabricated by other manufacturing processes such as a film forming process, and enables the probing to be carried out with good electrical continuity.

Further, the probe of the present invention can be applied to the case where it is required to establish contact with a lead frame of a semiconductor device which is formed by plating a soft solder on a material such as a 42-alloy, whereby a final test can be performed with good electrical continuity.

Additionally, the probe of the present invention can be applied to an operation test for an electronic circuit board on which semiconductors are mounted, enabling the probing to be carried out with good electrical continuity.

Embodiment 11

A member for removing foreign matter adhering to a probe tip, which is also intended by the present invention, will be described below.

Figure 13:
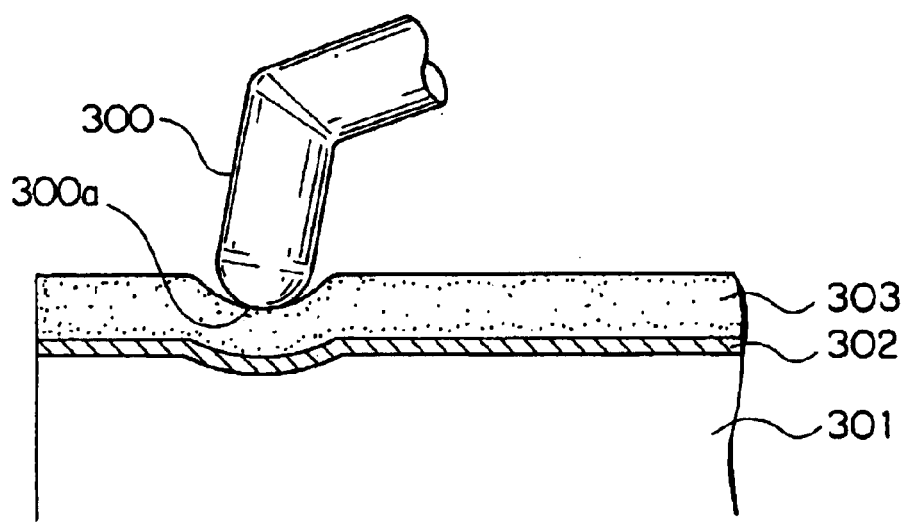
FIG. 13 is a sectional view showing a construction of a member for removing foreign matter adhering to a probe tip according to Embodiment 11 of the present invention.

FIG. 13 is a sectional view showing a construction of a member for removing foreign matter adhering to a probe tip according to Embodiment 11 of the present invention.

In FIG. 13, denoted by 300 is a probe having a tip face 300a formed into a spherical surface. Denoted by 301 is a resin member which serves as a base material and is made of a polyimide resin having a Young's modulus of 300 kgf/mm$^2$, for example. Denoted by 302 is a metallic member formed by coating, on the surface of the resin member 301, a film of metal material having relatively high tensile strength, e.g., Ti with tensile strength of not less than 20 kgf/mm$^2$, in thickness of 50–150 angstroms. Denoted by 303 is a ceramic member formed by coating a film of TiN in thickness of 5 microns or less on the surface of the metallic member 302.

In the member for removing foreign matter adhering to a tip of the probe 300, the resin member 301 serving as a base material is required to deform following the spherical shape (whose radius is 0.005–0.02 mm, for example) of the tip face 300a of the probe 300. More specifically, the resin member 301 is required to deform to such an extent that a hemispherical portion of the tip of the probe 300 sinks into the resin member about ½ of the radius thereof. Mechanical properties necessary for the resin member 301 to sink such an extent are determined to be 100–400 kgf/mm$^2$ on the basis of Heltz's contact stress formula, etc. As a resin meeting that requirement, a polyimide resin having a Young's modulus of 300 kgf/mm$^2$ is employed in this embodiment. Note that the material of the resin member 301 is not limited to polyimide resins, but may be any of those elastic materials meeting the above range of a Young's modulus. The resin member 301, which is made of a Teflon resin, a silicone resin or the like, can also deform following the spherical shape of the tip face 300a of the probe 300.

Assuming the case, for example, where the probe 300 with the tip having a diameter of 0.03 mm and the tip face having a radius of curvature of 0.02 mm is brought into contact with the surface of the resin member 301 under a contact pressure of 7 g, the tensile stress acting on the surface of the resin member 301 is on the order of 100 kgf/mm$^2$. Accordingly, the tip of the probe 300 is pierced into the resin member 301 because polyamide generally has tensile strength of 10–20 kgf/mm$^2$. For this reason, a film of Ti is coated on the surface of the resin member 301 in thickness of 50–150 angstroms to form the metal member 302 which is endurable against the contact stress.

More specifically, the tensile strength of Ti is on the order of 60 kgf/mm$^2$ at maximum in a normal state other than a thin-film state. However, when Ti is formed into a thin film, the presence probability of material defects is reduced and the tensile strength of a Ti thin film is increased 2–3 times the maximum tensile strength of Ti in the bulk form at a room temperature. In other words, by forming Ti into a thin film of 50–150 angstroms, the tensile strength of maximum 180 kgf/mm$^2$ is achieved. Thus, using such a thin film of Ti can prevent the probe 300 from piercing into the resin member 301 and breaking off the surface thereof. Incidentally, the material of the metallic member 302 is not limited to Ti, but may be, e.g., tungsten having tensile strength of not less than 20 kgf/mm$^2$.

Further, on the surface of the metallic member 302, a film of TiN is coated to form the ceramic member 303 serving as an abrasive layer in thickness of 0.1–5 microns. When the thickness of the TiN film is 0.1 micron, the surface roughness of the TiN film is substantially dominated and determined by the surface roughness of the resin member 301 and it is on the order of 0.05 micron Rmax. The surface roughness of the TiN film is gradually worsened as the thickness increases. When the thickness of the TlN film is about 5 microns, the surface roughness is on the order of 1 micron Rmax. If the thickness of the TiN film exceeds 5 microns, pliability of the TiN film would be lost to such an extent that the film may crack upon bending thereof and the film may peel off. Note that, in addition to TiN, the material of ceramic member 303 may be any of ceramic materials, such as diamond, TiCN and SiC, so long as it can be formed by CVD, sputtering, ion plating, etc.

Thus, according to Embodiment 11, by using, as a base material, the resin member 301 having a Young's modulus of 100–400 kgf/mm$^2$, the resin member 301 can be deformed following the tip face 300a of the probe 300. Also, by coating, on the surface of the resin member 301, the metallic member 302 having tensile strength of not less than 20 kgf/mm$^2$ in thickness of 50–150 angstroms, the tip of the probe 300 is prevented from piercing into the resin member 301 and breaking off the surface thereof. Further, by forming, as an abrasive layer, the ceramic member 303 in thickness of 0.1–5 microns on the surface of the metallic member 302, the ceramic member 303 is prevented from peeling off from the metallic member 302. As a result, even after repeating the cleaning, the tip of the probe 300 is avoided from thinning, and the probe life can be prolonged by the use of the member of removing foreign matter adhering to the probe tip of this embodiment.

Incidentally, in above-described Embodiment 11, a polyimide resin is used as the material of the resin member 301. The temperature of the resin member 301 is raised to 250–260° C. in the step of forming the metallic member 302, but the polyimide resin is sufficiently endurable against such a level of temperature because it is superior in heat resistance.

Embodiment 12

Figure 14:
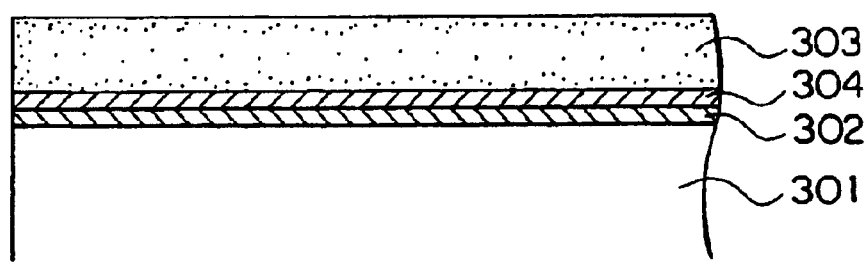
FIG. 14 is a sectional view showing a construction of a member for removing foreign matter adhering to a probe tip according to Embodiment 12 of the present invention.

FIG. 14 is a sectional view showing a construction of a member for removing foreign matter adhering to a probe tip according to Embodiment 12 of the present invention.

In FIG. 14, equivalent components to those in above Embodiment 11 are denoted by the same reference numerals for the description below. Denoted by 304 is a second metallic member formed by coating an Al alloy film in thickness of 0.1 micron on the surface of the first metallic member 302. The second metallic member 304 is interposed between the first metallic member 302 and the ceramic member 303.

With this Embodiment 12, since the second metallic member 304 is formed of an Al alloy film in thickness of 0.1 micron between the metallic member 302 and the ceramic member 303, even if the ceramic member 303 should crack due to bending moment caused upon contact of the tip face 300a of the probe 300, the crack would be kept from propagating to the metallic member 302 with the provision of the second metallic member 304 which is more extensible. While an Al alloy is used as the material of the second metallic member 304 in this embodiment, a similar advantage can also be obtained when the second metallic member 304 is formed by using any of Cu, Ag and Au which are highly extensible, or an alloy of these elements.

Embodiment 13

Figure 15:
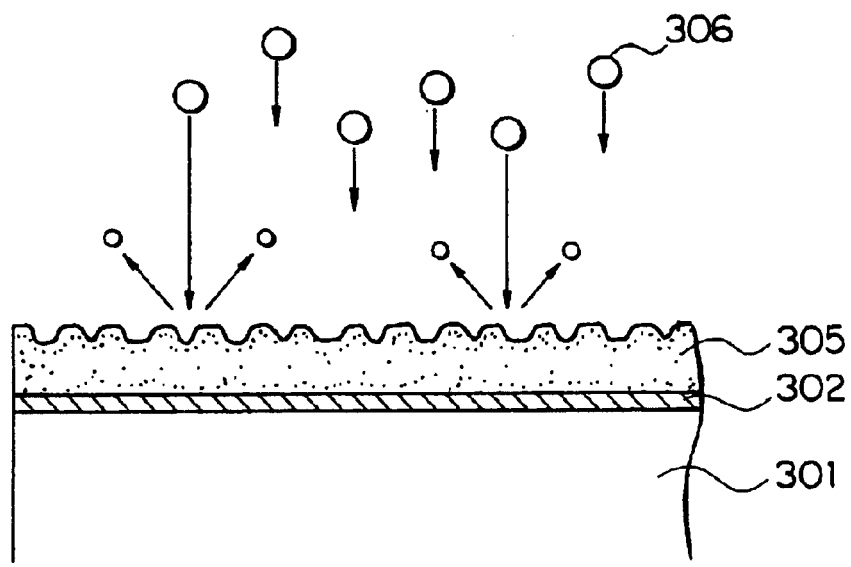
FIG. 15 is a sectional view showing a construction of a member for removing foreign matter adhering to a probe tip according to Embodiment 13 of the present invention.

FIG. 15 is a sectional view showing a construction of a member for removing foreign matter adhering to a probe tip according to Embodiment 13 of the present invention.

In FIG. 15, equivalent components to those in above Embodiment 11 are denoted by the same reference numerals for the description below. Denoted by 305 is a ceramic member which is formed by coating a film of TIN on the surface of the metallic member 302 in thickness of 5 microns and then irradiating ion particles 306 against the surface of the ceramic member so that the ceramic member surface is roughed to have larger surface roughness.

With this Embodiment 13, since the surface of the ceramic member 305 serving as an abrasive layer is roughed by sputtering to have larger surface roughness, foreign matter adhering to the probe tip can be easily removed with an improved polishing characteristic.

Additionally, in the case where the metallic member 302 is formed on the surface of the resin member 301 in thickness of 50–150 angstroms and the ceramic member 303 is formed on the surface of the metallic member 302 in thickness of 0.1 micron as with above Embodiment 11, the surface roughness of the ceramic member 303 is substantially dominated and determined by the surface roughness of the resin member 301 and it is on the order of 0.05 micron Rmax, as described above. Also, the surface roughness is worsened as the film thickness of the ceramic member 303 increases. However, when TiN is used as the material of the ceramic member 303, a maximum limit of the film thickness is 5 microns from the viewpoints of film pliability and cost. At such a maximum limit, the surface roughness of the ceramic member 303 is about 1 micron.

By roughing the surface of the ceramic member 305 by sputtering like this Embodiment 13, the ceramic, member 305 can have surface roughness of about 3 microns at maximum and the polishing characteristic is improved.

Embodiment 14

Figure 16:
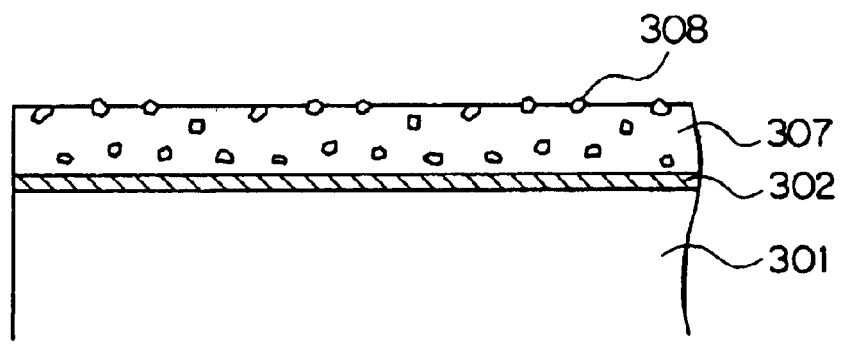
FIG. 16 is a sectional view showing a construction of a member for removing foreign matter adhering to a probe tip according to Embodiment 14 of the present invention.

FIG. 16 is a sectional view showing a construction of a member for removing foreign matter adhering to a probe tip according to Embodiment 14 of the present invention.

In FIG. 16, equivalent components to those in above Embodiment 11 are denoted by the same reference numerals for the description below. Denoted by 307 is a nickel plated layer formed on the surface of the metallic member 302 in thickness of 1 micron, and 308 is a SiC particle fixedly dispersed in the nickel plated layer 307. The SiC particle 308 has a diameter 0.3 micron smaller than the thickness of the nickel plated layer 307.

With this Embodiment 14, since the nickel plated layer 307 being 5 microns or below thick is formed on the surface of the metallic member 302 and the SiC particles 308 are fixedly dispersed in the nickel plated layer 307, corners of the SiC particles 308 are projecting upward of the nickel plated layer 307, as shown, to scrape off foreign matter adhering to the tip face of the probe. As a result, contaminants on the probe tip face can be efficiently removed.

While, in above Embodiment 14, an abrasive layer is formed by fixedly dispersing the SiC particles 308 in the nickel plated layer 307, particles to be dispersed are not limited to SiC particles, but may be particles of any other ceramic suitable materials. The use of Si particles is however advantageous in that contaminants can be more efficiently removed because aluminum adhering to the tip face of the probe agglutinates with silicon due to chemical action between both.

Additionally, while the nickel plated layer 307 is optimally formed by non-electrolytic plating, electrolytic plating is also applicable because the layer 307 is formed on the metallic member 302.

Embodiment 15

Figure 17:
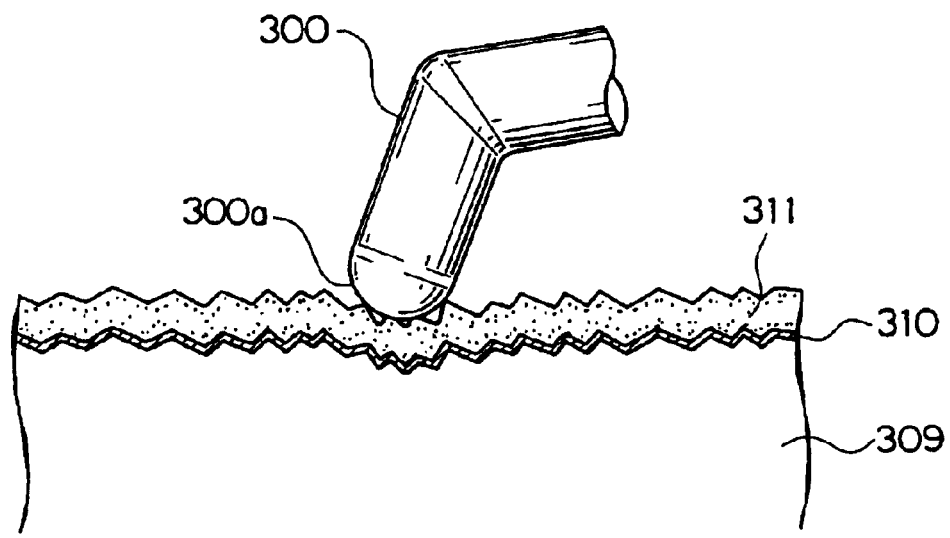
FIG. 17 is a sectional view showing a construction of a member for removing foreign matter adhering to a probe tip according to Embodiment 15 of the present invention.

FIG. 17 is a sectional view showing a construction of a member for removing foreign matter adhering to a probe tip according to Embodiment 15 of the present invention.

In FIG. 17, equivalent components to those in above Embodiment 11 are denoted by the same reference numerals for the description below. Denoted by 309 is a resin member of which surface is roughed by corrosion with chemicals, impingement of ion particles, or sand blasting, for example, so as to have large surface roughness, and 310, 311 are films of metallic member and ceramic member successively formed on the surface of the resin member 309 in this order. These films of metallic member and ceramic member 313, 314 are formed similarly to the metallic member 302 and the ceramic member 303 in above Embodiment 11, respectively.

With this Embodiment 15, since the resin member 309 is formed to have large surface roughness and the films of metallic member 310 and ceramic member 311 are successively formed on the surface of the resin member 309 in this order, the foreign-matter removing member can easily have surface roughness on the order of 1–10 microns, and the efficiency of removing foreign matter adhering to the probe tip can be improved.

Embodiment 15 has been described as successively forming the metallic member 310 and the ceramic member 311 on the resin member 309 similarly to above Embodiment 11. It is however needless to say that a similar advantage can also be obtained when applied to the case of forming a second metallic member between the metallic member 310 and the ceramic member 311 as with above Embodiment 12.

Embodiment 16

Figure 18:
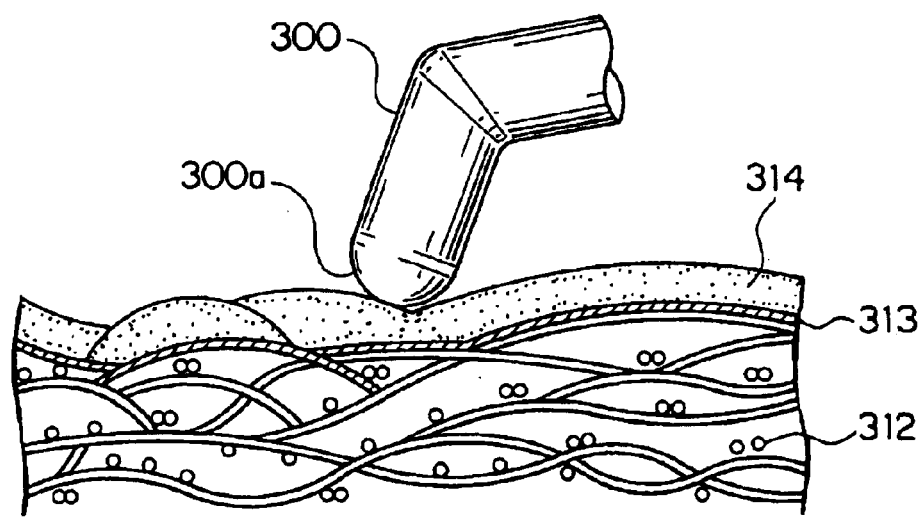
FIG. 18 is a sectional view showing a construction of a member for removing foreign matter adhering to a probe tip according to Embodiment 16 of the present invention.

FIG. 18 is a sectional view showing a construction of a member for removing foreign matter adhering to a probe tip according to Embodiment 16 of the present invention.

In FIG. 18, equivalent components to those in above Embodiment 11 are denoted by the same reference numerals for the description below. Denoted by 312 is a fiber member which is formed of polyimide fibers, for example, and has apparent a Young's modulus comparable to that of the resin member 301 in above Embodiment 11, with alcohol impregnated in the fiber member. Denoted by 313, 314 are films of metallic member and ceramic member successively formed on the surface of the fiber member 312 in this order. These films of metallic member and ceramic member 313, 314 are formed similarly to the metallic member 302 and the ceramic member 303 in above Embodiment 11, respectively.

With this Embodiment 16, since the fiber member 312 is formed as a lowermost layer, the tip face 300a of the probe 300 comes into contact with the fiber member 312 after penetrating both the ceramic member 314 and the metallic member 313, and foreign matter adhering to the probe tip are removed with relative slippage between the tip face 300a and the fiber member 312. Further, the surface tension of the alcohol impregnated in the fiber member 312 acts to capture fine dust generated upon removal of the foreign matter adhering to the probe tip, and hence prevent the fine dust from being scattered into open air.

While Embodiment 16 has been described as using resin fibers, e.g., polyimide fibers, as the material of the fiber member 312, it is needless to say that metallic fibers is also applicable if they can be processed into the form of cloth and can have apparent a Young's modulus comparable to that of the resin fibers.

Embodiment 17

Figure 19:
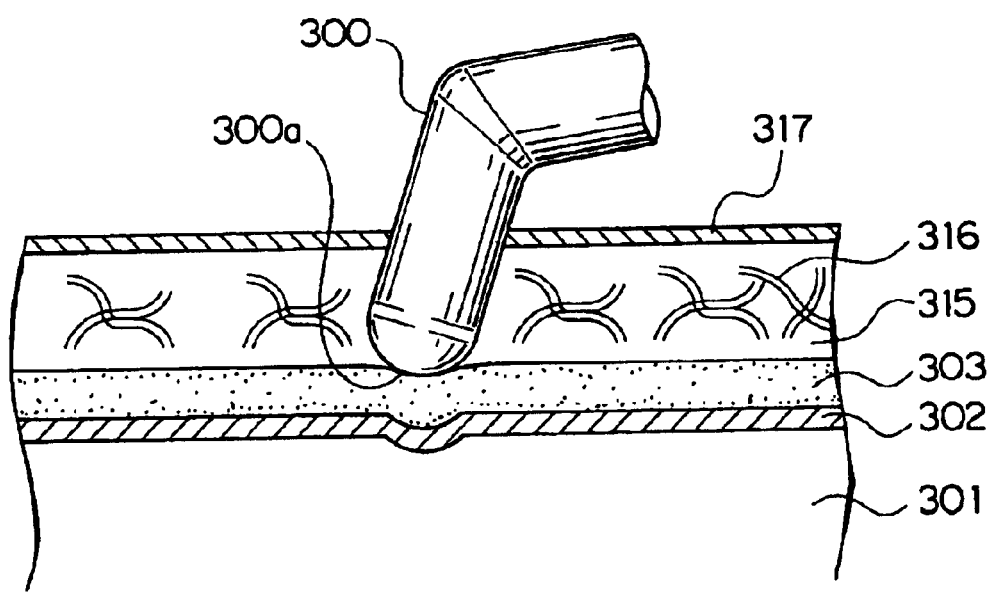
FIG. 19 is a sectional view showing a construction of a member for removing foreign matter adhering to a probe tip according to Embodiment 17 of the present invention.

FIG. 19 is a sectional view showing a construction of a member for removing foreign matter adhering to a probe tip according to Embodiment 17 of the present invention.

In FIG. 19, equivalent components to those in above Embodiment 11 are denoted by the same reference numerals for the description below. Denoted by 315 is a liquid holding member which is provided on the surface of the ceramic member 303 and formed of cloth, sponge or the like fabricated by fine fibers, for example, with a liquid 316, e.g., alcohol, impregnated in the liquid holding member. Denoted by 317 is an evaporation preventive member which is provided to cover the surface of the liquid holding member 315 and is formed of, e.g., a resin film.

With this Embodiment 17, the liquid holding member 315 impregnated with the liquid 316 is provided on the surface of the ceramic member 303 so that the tip face 300a of the probe 300 comes into contact with the surface of the ceramic member 303 after penetrating the liquid holding member 315. Accordingly, even if there produces dust such as an aluminum oxide removed from the probe 300 with relative slippage between the tip face 300a of the probe 300 and the ceramic member 303, or fragments of the ceramic member 303 chipped off upon contact between both, those dust and fragments are caught by the fibers of the liquid holding member 315 and adsorbed by the surface tension of the liquid 316. As a result, the probe 300 can be maintained clean after polishing, and a trouble such as a contact failure in the wafer test can be avoided.

Further, since the evaporation preventive member 317 is provided to cover the surface of the liquid holding member 315, it is possible to prevent evaporation of the liquid 316 such as alcohol.

While alcohol, for example, is used as the liquid 316 in this embodiment, the liquid 316 is not limited to alcohol, but may be any other suitable liquid so long as it will volatilize without corroding the probe 300 after the operating removing the foreign matter adhering to the probe tip.

Embodiment 18

Figure 20:
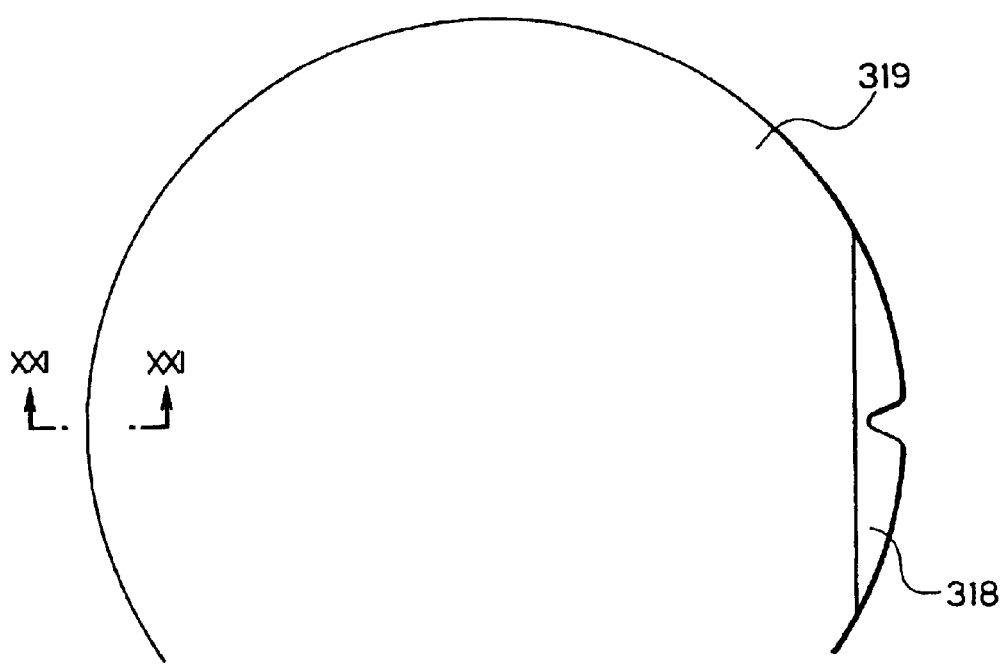
FIG. 20 is a sectional view showing a construction of a member for removing foreign matter adhering to a probe tip according to Embodiment 18 of the present invention.
Figure 21:
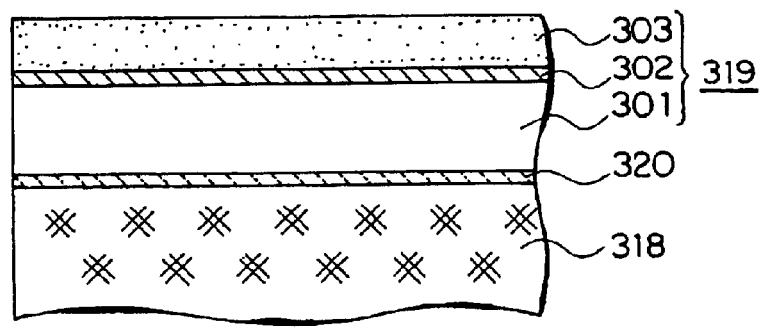
FIG. 21 is a sectional view taken along line XXI—XXI in FIG. 20.
Figure 22A:
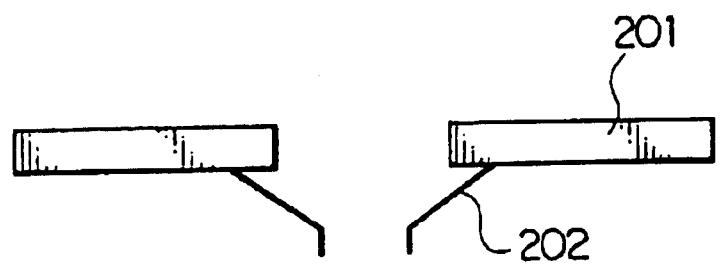
FIG. 22A is an explanatory view for explaining a conventional probe apparatus.
Figure 22B:
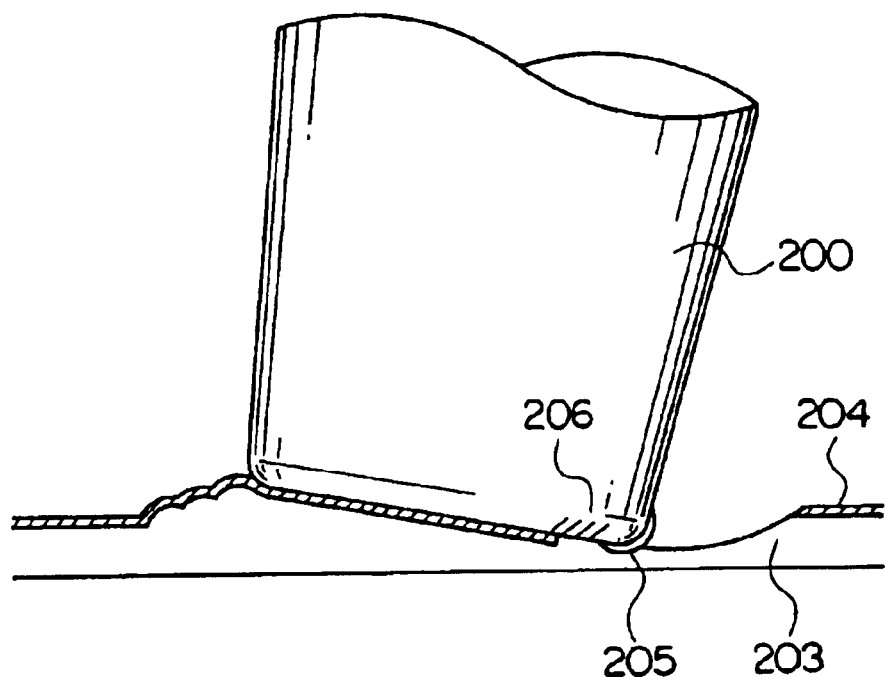
FIG. 22B is an explanatory view showing a contact condition of a probe and a pad in the related art.
Figure 23:
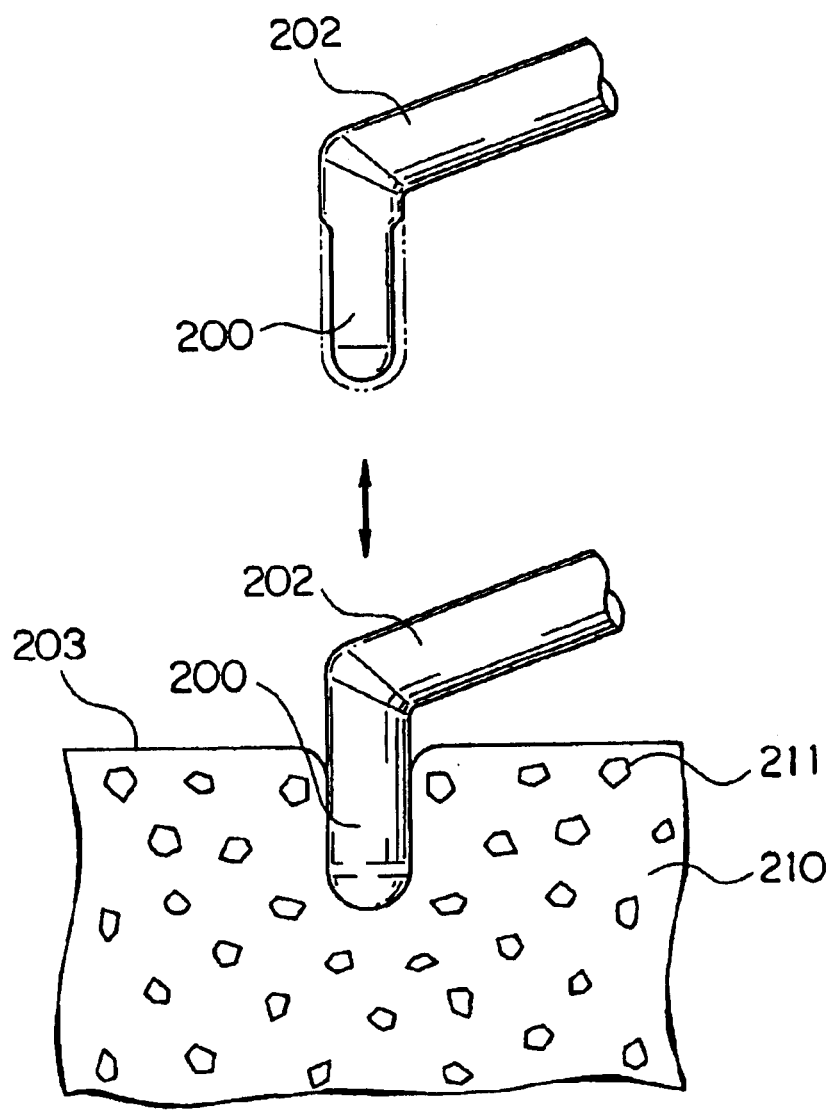
FIG. 23 is a sectional view showing the relationship between a probe and a member for removing foreign matter adhering to a probe tip in the related art under grinding.

FIG. 20 is a plan view showing a construction of a member for removing foreign matter adhering to a probe tip according to Embodiment 18 of the present invention, and FIG. 21 is a sectional view taken along line XXI—XXI in FIG. 20.

In FIGS. 20 and 21, equivalent components to those in above Embodiment 11 are denoted by the same reference numerals for the description below. Denoted by 318 is a base comprising a plastic plate made of Teflon, polyethylene, polypropylene or the like, the base being formed to have the same shape and size as a silicon wafer. A removing member 319 comprised of the resin member 301, the metallic member 302 and the ceramic member 303 is bonded to the surface of the base 318 with an adhesive layer 320 which comprises, e.g., a polyimide material or an epoxy-base adhesive.

With Embodiment 18, since the removing member 319 is bonded to the surface of the base 318 formed to have the same shape and size as a silicon wafer, the removing member 319 can be transferred by a prober as with silicon wafers. By setting the base 318, onto which the removing member 319 is bonded, for each predetermined number of silicon wafers, therefore, foreign matter adhering to the probe tip can be automatically removed. Also, by employing, as the base 318, a plastic plate made of Teflon, polyethylene, polypropylene or the like which are superior in resistance against chemicals, it is possible to repeatedly regenerate the removing member 319 by removing aluminum, etc. adhering to it in a chemical manner using an acid or alkali. As a result, a service life of the removing member 319 can be prolonged.

Moreover, a similar advantage can also be obtained by bonding the removing member 319 through the adhesive layer 320 directly to a silicon wafer without using the base 318.

Embodiment 19

In above Embodiments 11 to 18, the constructions of the foreign-matter removing members have been described. In this Embodiment 19, a manufacture method for bonding the removing member 319 onto the base 318 or directly a silicon wafer like Embodiment 18 is described.

First, the resin member 301 is placed on the base 318 through the adhesive layer 320 which comprises, e.g., a polyimide material or an epoxy-base adhesive and is not yet hardened. Then, by pressing an assembly under pressure in vacuum, the resin member 301 is brought into pressure contact with the base 318. After that, the metallic member 302 and the ceramic member 303 are successively formed as films on the surface of the resin member 301 in this order, thereby completing the member for removing foreign matter adhering to a probe tip.

With Embodiment 19, since the resin member 301 is placed on the base 318 through the adhesive layer 320 and the resin member 301 is brought into pressure contact with the base 318 under pressing in vacuum, the resin member 301 having a sufficient thickness can be easily obtained.

Embodiment 20

In above Embodiment 19, the resin member 301 is placed on the base 318 through the adhesive layer 320 and the resin member 301 is brought into pressure contact with the base 318 under pressing in vacuum. In a manufacture method according to this Embodiment 20, a resin material is placed on the base 318 and then subject to spin coating to form a film. The film is heated and dried so as to harden, thereby forming the resin member 301. After that, the metallic member 302 and the ceramic member 303 are successively formed as films on the surface of the resin member 301 in this order, thereby completing the member for removing foreign matter adhering to a probe tip.

With Embodiment 20, since the resin member 301 is formed by spin-coating a resin material directly on the base 318, the bonding step can be omitted and a reduction in manufacturing cost and time can be achieved.

As described hereinabove, with the test probe for semiconductor devices according to the present invention, the probe tip can efficiently develop a shearing deformation in the pad during the probing, whereby a contact surface can be established between the probe tip and the pad with a sufficient degree of electrical continuity.

Also, with the test probe for semiconductor devices according to the present invention, the probe tip can be always brought into contact with a fresh surface of the pad to provide a sufficient degree of electrical continuity.

With the test probe for semiconductor devices according to the present invention, when a probe level is adjusted in the probing, a time required for positioning the probe prior to the start of measurement is cut down and variations in measurement are reduced.

Further, with the method of manufacturing the test probe for semiconductor devices according to the present invention, there is obtained such a probe end shape that a flat portion is formed at the probe tip and the flat portion is joined with a spherical surface by a smooth curved surface. As a result, a probe capable of providing good electrical continuity and being easily positioned in place can be manufactured.

In addition, stresses are less concentrated on the pad, whereby damages upon the pad and the layer lying under the pad can be abated.

With the method of manufacturing the test probe for semiconductor devices according to the present invention, voids in the vicinity of the grain boundary can be collapsed under action of pressure while crystals in the metal material are suppressed from becoming coarse. Accordingly, the voids are remarkably reduced and mechanical properties are made uniform. By employing the probe which has been subject to the heat treatment of the present invention, therefore, a probe having good and uniform electrical characteristics can be provided. As a result, a margin that must be taken into consideration in relation to an amount of pressing of the probe into the pad can be reduced, and electrical continuity can be established for all probes under a smaller probe load.

With the method of manufacturing the test probe for semiconductor devices according to the present invention, since the voids are remarkably reduced and mechanical properties are made uniform by properly carrying out the heat treatment of the present invention, it is possible to overcome such a conventional problem that, in a probe made of, e.g., tungsten and containing voids therein, substances having large electrical resistance, such as oxides peeled off from the pad, may enter the voids to impede establishment of electrical continuity during the probing. As a result, a probe having good and uniform electrical characteristics can be provided.

With the test probe for semiconductor devices according to the present invention, there appear no material defects in the probe tip face after being finished, and hence stable contact can be achieved with even with a probe having a conventional probe tip shape.

With the test probe for semiconductor devices according to the present invention, even when the pad is subject to high temperatures due to a shearing deformation during the probing, oxidation of the metal material constituting the probe can be avoided, and therefore a probe having good electrical continuity can be provided.

With the probe apparatus according to the present invention, a probe apparatus having good electrical continuity between the probe tip and the pad can be provided.

With one testing method according to the present invention, the probe tip face can be stably brought into contact with a fresh surface of the test pad material, and the probing can be performed with good electrical continuity.

With another testing method according to the present invention, the probe tip shape can be easily checked.

With the semiconductor device according to the present invention, a projection is formed on the test pad. When wire boding, for example, is performed on the test pad, a bonding time can be shortened by utilizing the projection.

With the member for removing foreign matter adhering to a probe tip according to the present invention, the probe tip can be avoided from thinning and the probe life can be prolonged.

Also, with the member for removing foreign matter adhering to a probe tip according to the present invention, the probe tip can be avoided from thinning, cracks occurred in the ceramic member can be kept from propagating into the metallic member, and the probe life can be further prolonged.

Further, with the member for removing foreign matter adhering to a probe tip according to the present invention, the polishing characteristic can be improved in addition to the above advantages that the probe tip can be avoided from thinning and the probe life can be prolonged.

With the member for removing foreign matter adhering to a probe tip according to the present invention, heat resistance of the base material can be improved in addition to the above advantages that the probe tip can be avoided from thinning and the probe life can be prolonged.

With the member for removing foreign matter adhering to a probe tip according to the present invention, the efficiency of removing foreign matter can be improved in addition to the above advantages that the probe tip can be avoided from thinning and the probe life can be prolonged.

With the member for removing foreign matter adhering to a probe tip according to the present invention, the removed foreign matter can be avoided from being scattered into open air in addition to the above advantages that the probe tip can be avoided from thinning and the probe life can be prolonged.

With the member for removing foreign matter adhering to a probe tip according to the present invention, the removed foreign matter can be more surely avoided from being scattered into open air in addition to the above advantages that the probe tip can be avoided from thinning and the probe life can be prolonged.

With the member for removing foreign matter adhering to a probe tip according to the present invention, evaporation of the liquid impregnated in the liquid holding member can be avoided.

With the member for removing foreign matter adhering to a probe tip according to the present invention, it is possible to automate removal of the foreign matter and prolong the service life of the removing member.

With the method of manufacturing the member for removing foreign matter adhering to a probe tip according to the present invention, the resin member having a sufficient thickness can be easily obtained.

Finally, with the method of manufacturing the member for removing foreign matter adhering to a probe tip according to the present invention, the step of bonding the resin member can be omitted.

What is claimed is:

1. A member for removing foreign matter adhering to a test probe tip that is brought into contact with the member, wherein said member comprising:

a resin member capable of elastic deformation, a first metallic member formed on a surface of said resin member as a continuous film having predetermined tensile strength, and a ceramic member formed on a surface of said metallic member as a continuous film having a predetermined thickness.

2. A member for removing foreign matter adhering to a test probe tip according to claim 1, wherein the surface of said ceramic member is formed to have a great surface roughness by sputtering.

3. A member for removing foreign matter adhering to a test probe tip according to claim 1, wherein surface roughness of the surface of said ceramic member, by sputtering, being about 3 microns maximum.

4. A member for removing foreign matter adhering to a test probe tip according to claim 1, wherein a second metallic member formed on the surface of said first metallic member, interposed between said first metallic member and said ceramic member being more extensible than said first metallic member.

5. A member for removing foreign matter adhering to a test probe tip that is brought into contact with the member, wherein said member comprising:

a resin member capable of elastic deformation, a first metallic member formed on a surface of said resin member as a continuous film having predetermined tensile strength, and a ceramic member formed on a surface of said metallic member as a film continuously along a principal surface, which has a predetermining thickness.

* * * * *